United States Patent
Matto et al.

(10) Patent No.: US 6,833,655 B2
(45) Date of Patent: Dec. 21, 2004

(54) MONOLITHIC PIEZOELECTRIC TRANSFORMER AND METHOD FOR MANUFACTURING THE SAME

(75) Inventors: Takahiro Matto, Kusatsu (JP); Toshiaki Kaji, Yokaichi (JP); Toshio Imanishi, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/453,577

(22) Filed: Jun. 4, 2003

(65) Prior Publication Data

US 2004/0000845 A1 Jan. 1, 2004

(30) Foreign Application Priority Data

Jun. 27, 2002 (JP) ........................................ 2002-187351

(51) Int. Cl.[7] .............................................. H01L 41/08
(52) U.S. Cl. ...................................... 310/359; 310/316
(58) Field of Search ................................ 310/359, 316, 310/317, 318, 319

(56) References Cited

U.S. PATENT DOCUMENTS 5,440,195 A * 8/1995 Ohnishi et al. ............. 310/359
5,705,879 A * 1/1998 Abe et al. ................... 310/359
5,736,807 A * 4/1998 Hakamata et al. .......... 310/359
5,751,092 A * 5/1998 Abe ............................ 310/359
5,935,485 A * 8/1999 Tani et al. ............ 252/62.9 PZ
6,229,251 B1 * 5/2001 Asada et al. ................ 310/366
6,384,517 B1 * 5/2002 Kojima et al. .............. 310/358

FOREIGN PATENT DOCUMENTS

JP          10-051044       2/1998
JP          11-186630       7/1999

* cited by examiner

Primary Examiner—Chau N. Nguyen
(74) Attorney, Agent, or Firm—Dickstein, Shapiro, Morin & Oshinsky, LLP.

(57) ABSTRACT

A monolithic piezoelectric transformer includes a drive portion and a power generation portion. The drive portion includes a plurality of polarized piezoelectric ceramic layers and a plurality of internal electrodes that are alternately layered on each other. The drive portion is provided with external input electrodes connected to the internal electrodes. The power generation portion includes a piezoelectric ceramic member and an output electrode. The internal electrodes are formed of a fired metal containing at least one of silver and palladium and at least one of rhodium and iridium.

12 Claims, 5 Drawing Sheets

MONOLITHIC PIEZOELECTRIC TRANSFORMER AND METHOD FOR MANUFACTURING THE SAME

BACKGROUND OF THE INVENTION

1. Field of the Invention

The present invention relates to a monolithic piezoelectric transformer for use in an inverter for the backlight of a liquid crystal display, an inverter for starting a fluorescent tube, or the like, and to a method for manufacturing the same.

2. Description of the Related Art

A piezoelectric transformer has been proposed as a miniature power supply for generating a high voltage in order to reduce the size of electronic apparatuses driven by the high voltage, such as inverters of transistor TV sets and for starting fluorescent tubes.

Monolithic piezoelectric transformers generally have a rectangular body. The body includes a drive portion and a power generation portion adjoining the drive portion in the longitudinal direction.

The power generation portion has a piezoelectric member polarized in the longitudinal direction of the body and an output electrode formed on an end surface in the longitudinal direction of the body. The drive portion includes internal electrodes and piezoelectric ceramic layers that are alternately layered in the thickness direction, and a pair of external input electrodes. The piezoelectric ceramic layers are alternately connected to one of the external input electrodes or the other.

In a process of preparing such a drive portion, piezoelectric ceramic green sheets onto which an internal electrode paste has been applied in an electrode shape are layered and contact-bonded to one another in the thickness direction to form a rectangular monolithic piezoelectric composite. The monolithic composite is fired, and thus, the drive portion is obtained.

A known internal electrode paste mainly contains a silver-palladium conductive powder, and further contains a gold resinate as an organic metal material for controlling the sintering of the silver.

The thickness of the piezoelectric ceramic layers is often increased in order to adjust the step-up ratio of a monolithic piezoelectric transformer. In this instance, however, the diffusion of the silver in the composition progresses to seriously degrade the continuity of the electrodes if the internal electrodes are formed of such a conventional composition. Consequently, the strength of the ceramic layers is negatively affected and the characteristic values are varied.

SUMMARY OF THE INVENTION

Accordingly, an object of the present invention is to provide a monolithic piezoelectric transformer using an internal electrode material capable of maintaining the continuity of the electrodes after firing even if the thickness of the piezoelectric ceramic layers is increased.

To this end, there is provided a monolithic piezoelectric transformer according to one aspect of the present invention, having a plurality of piezoelectric ceramic layers that are integrally sintered. The monolithic piezoelectric transformer includes a drive portion and a power generation portion. The driver portion includes the plurality of piezoelectric ceramic layers polarized in the layered direction, a plurality of internal electrodes alternately layered with the piezoelectric layers, and a pair of external input electrodes connected to the internal electrodes. The power generation portion includes a piezoelectric ceramic member polarized in the direction perpendicular to the layered direction and an output electrode. The internal electrodes comprise a primary metal comprising at least one of silver and palladium and a secondary metal comprising at least one of rhodium and iridium.

Since the internal electrodes contain the secondary metal, the primary metal is prevented from diffusing into the piezoelectric ceramic layers during sintering. Consequently, the continuity of the internal electrodes is maintained. Also, a decrease of ceramic layer strength resulting from the diffusion of the primary metal is prevented. Thus, the variations in the properties of the electrodes can be reduced.

Preferably, the content of the secondary metal is in the range of about 0.01 to 5 parts by weight relative to 100 parts by weight of the primary metal. If the secondary metal content is less than about 0.01 part by weight, the primary metal cannot sufficiently be prevented from diffusing into the piezoelectric ceramic layers during sintering. If the secondary metal content is more than about 5 parts by weight, the diffusion is reduced to some extent but the characteristics are not satisfactorily improved and costs are increased.

Preferably, the secondary metal is in a metal organic form before sintering. By using a metal organic for the secondary metal, the primary metal is further prevented from diffusing into the piezoelectric ceramic layers during sintering. Thus, the variation of properties can further be reduced.

According to another aspect of the present invention, a method for manufacturing a monolithic piezoelectric transformer is provided. The method includes the step of applying an internal electrode paste containing a primary metal comprising at least one of silver and palladium and a secondary metal comprising at least one of rhodium and iridium onto green sheets containing a piezoelectric ceramic material to form an internal electrode paste layer on each green sheet. The method also includes the steps of layering the green sheets with the internal electrode paste layer on one another to prepare a piezoelectric ceramic composite; and firing the piezoelectric ceramic composite. In another step, the fired piezoelectric ceramic composite is polarized in the layered direction thereof to prepare a drive portion, and the fired piezoelectric ceramic composite is polarized in the direction perpendicular to the layered direction to prepare a power generation portion. In still another step, a pair of external input electrodes connected to the internal electrode paste layers is formed on the drive portion, and an output electrode is formed on the power generation portion.

According to the method of the present invention, the foregoing monolithic piezoelectric transformer can be manufactured with a good reproducibility.

Preferably, the content of the secondary metal in the internal electrode paste is in the range of about 0.01 to 5 parts by weight relative to 100 parts by weight of the primary metal. Preferably, the secondary metal is in metal organic form.

DESCRIPTION OF THE PREFERRED EMBODIMENTS

Figure 1:
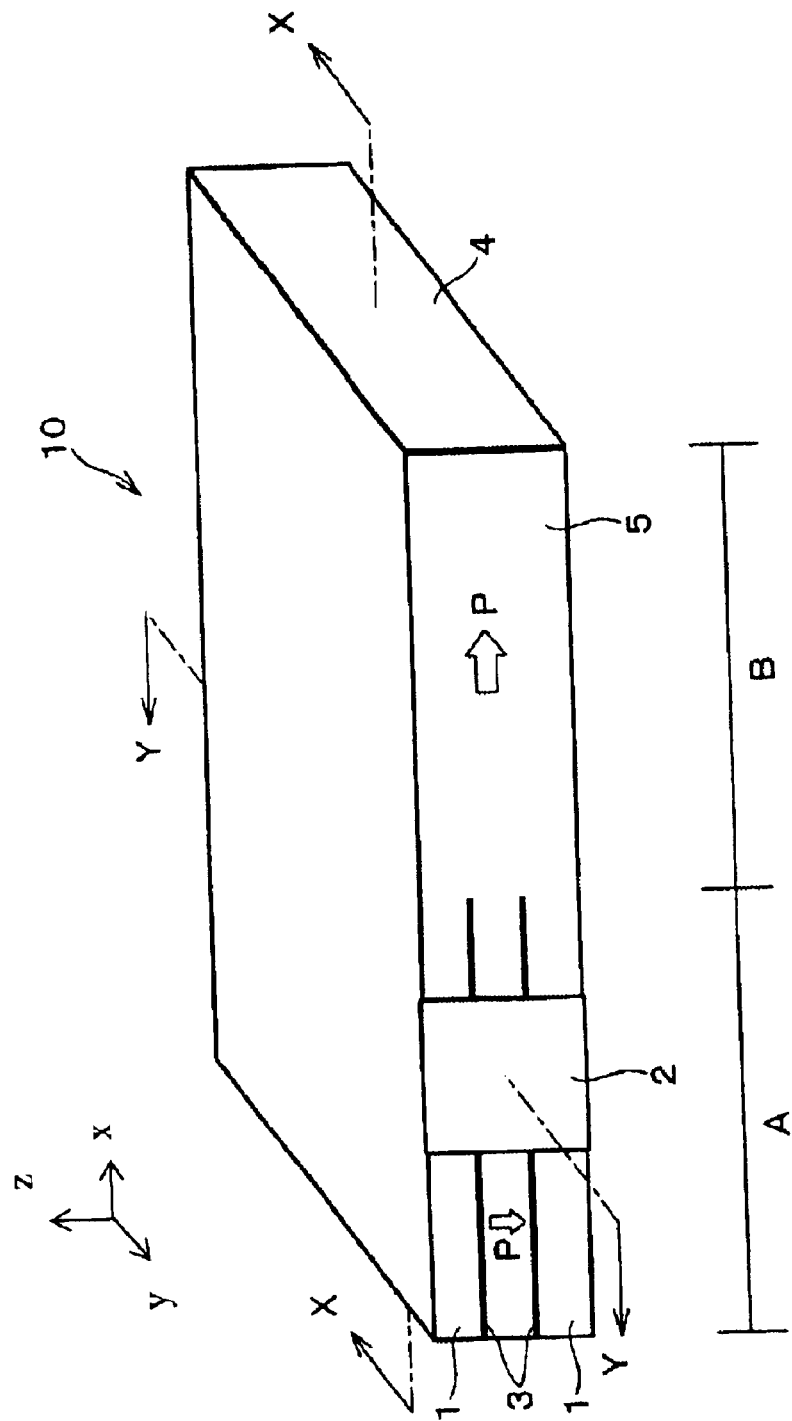
FIG. 1 is a schematic perspective view of a monolithic piezoelectric transformer of the present invention.
Figure 2:
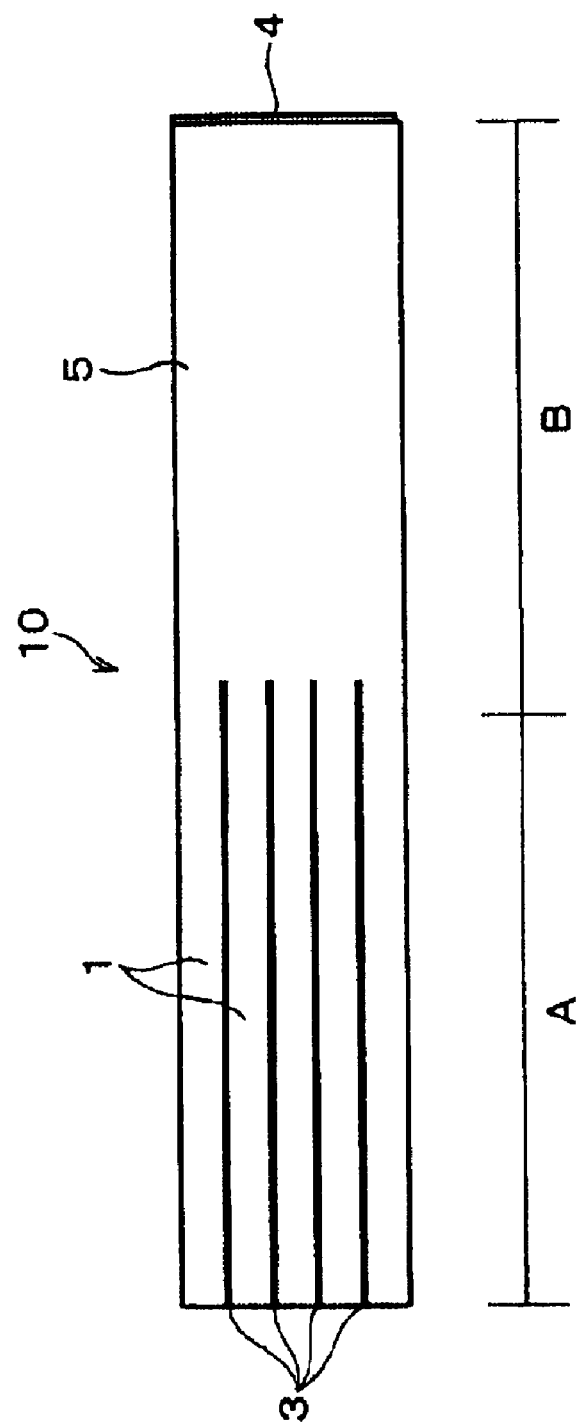
FIG. 2 is a longitudinal sectional view taken along line X—X of FIG. 1.
Figure 3:
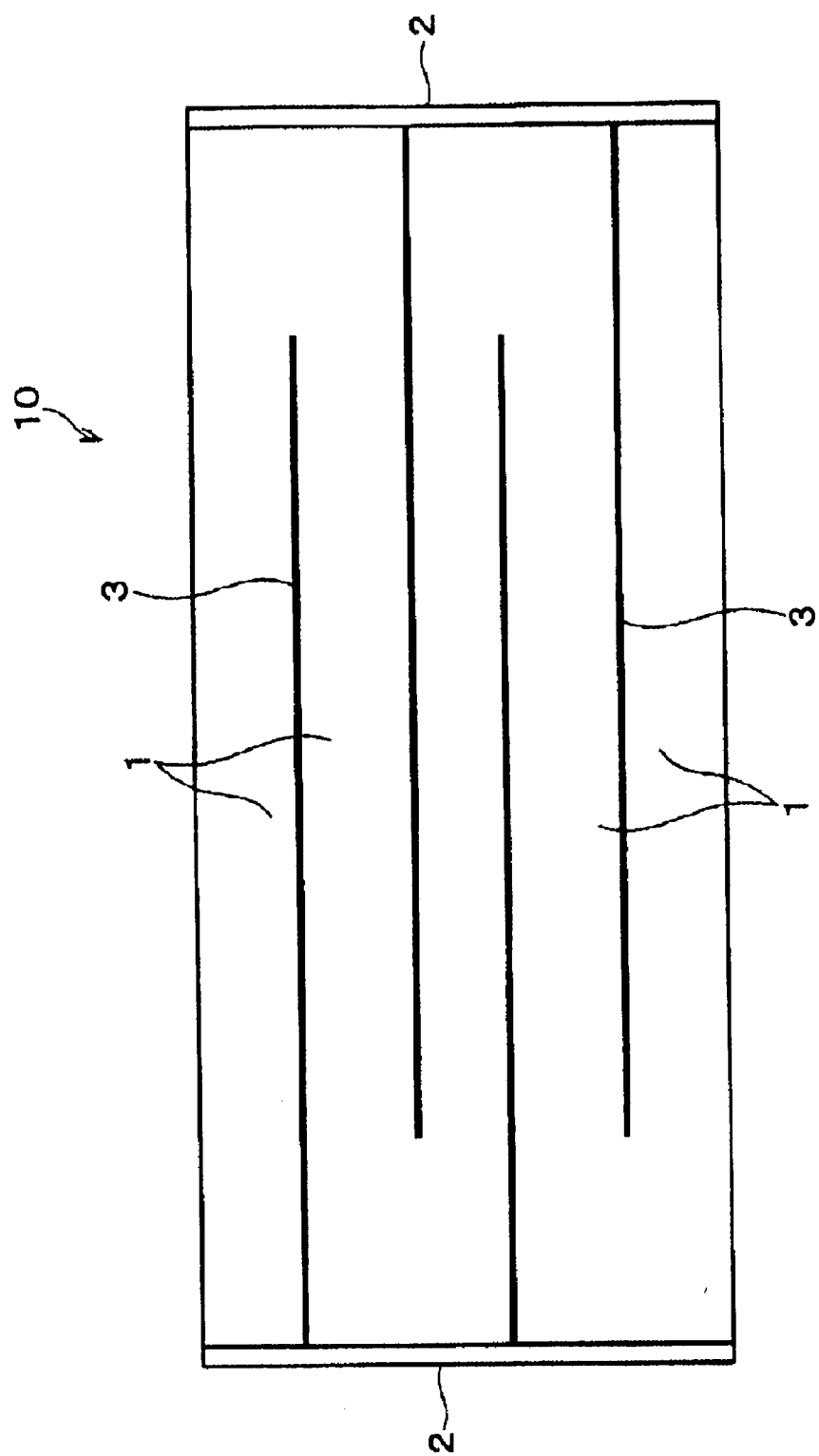
FIG. 3 is a longitudinal sectional view taken along line Y—Y of FIG. 1.

A monolithic piezoelectric transformer of the present invention will now be described with reference to FIGS. 1 to 3.

A monolithic piezoelectric transformer 10 is formed in a rectangular shape. The monolithic piezoelectric transformer 10 includes a drive portion A and a power generation portion B adjoining the drive portion A in the longitudinal direction thereof, or the X-axis direction in the drawing.

The power generation portion B includes a piezoelectric ceramic member 5 polarized in the longitudinal direction, or the X-axis direction, as designated by one of arrows P, and an output electrode 4 formed on the longitudinal end surface of the piezoelectric ceramic member 5. The piezoelectric ceramic member 5 resonates with mechanical oscillation propagating thereto to efficiently generate high voltage. The output electrode 4 is intended to draw out the high voltage generated from the piezoelectric ceramic member 5 that is treated as a potential difference between the output electrode 4 and one of a pair of external input electrodes 2, described later.

The drive portion A includes internal electrodes 3 and piezoelectric ceramic layers 1 alternately layered on each other in the layered direction of the monolithic piezoelectric transformer, or in the z-axis direction in the drawing. The piezoelectric ceramic layers 1 are polarized in this layered direction, as designated by the rest of arrows P.

The drive portion A also has the pair of external input electrodes 2 formed on the end surfaces of the monolithic piezoelectric transformer in the y-axis direction in the drawing. Specifically, the internal electrodes 3 are alternately exposed at one end surface of the body of the monolithic piezoelectric transformer in the width direction, or the y-axis direction in the drawing, and at the other surface. The insulation between any two internal electrodes 3 opposing each other is ensured by disposing the piezoelectric layer 1 therebetween. One of the pair of external input electrodes 2 is connected to one of the two opposing internal electrodes 3, and the other external input electrode 2 is connected to the other internal electrode 3.

In a monolithic piezoelectric transformer having such a structure, a transformation ratio substantially equivalent to the square root of the impedance ratio can be obtained during resonance by setting the impedances of the input side and the output side to be low and high, respectively. In order to produce the drive portion A, piezoelectric ceramic green sheets onto which an internal electrode paste has been applied in a shape of the internal electrodes 3 are layered and contact-bonded on one another in the thickness direction to form a rectangular monolithic piezoelectric composite, and the monolithic composite is fired.

The internal electrodes 3 of the monolithic piezoelectric transformer of the present invention are fired metallic electrodes comprising a primary metal comprising at least one of silver and palladium and a secondary metal comprising at least one of rhodium and iridium.

EXAMPLES

Examples of the monolithic piezoelectric transformer of the present invention will now be described in which the internal electrodes 3 are formed of an internal electrode paste containing the primary metal and the secondary metal.

First Examples

In Examples 1 to 12, the primary metal is a conductive powder prepared by coprecipitating Ag and Pd at a weight ratio of 70:30. Into 94 parts by weight of a terpene solvent, 6 parts by weight of an ethyl cellulose resin was slowly added and stirred for 24 hours to prepare an organic vehicle. Into 40 parts by weight of the organic vehicle, 100 parts by weight of the coprecipitated conductive powder containing Ag and Pd at a ratio of Ag: Pd=70:30 and an organic metal (balsam sulfide Rh or balsam sulfide Ir) were added. The amount of the organic metal was set according to the content of the secondary metal element shown in Table 1. The mixture was kneaded with a three-roll kneader to yield an internal electrode paste.

On the other hand, lead zirconate titanate (PZT) and other piezoelectric ceramic materials were mixed and calcined at a temperature of about 900° C. to prepare a powder. The powder was mixed with a binder and an additive, such as a plasticizer, to prepare a slurry. The slurry was formed into green sheets having a thickness of about 100 μm by the doctor blade method.

Each of the internal electrode pastes in Examples 1 to 12 was applied onto the green sheets by screen printing, followed by drying. The resulting green sheets having an internal electrode layer were layered on one another such that one end of the internal electrode layers were alternately exposed at one side surface and the other side surface opposing each other. The layered green sheets were contact-bonded by heat pressing to obtain a monolithic composite.

Then, binder components were removed from the composite at a temperature of about 500° C. and the resulting composite was fired at 1100 to 1200° C. for several hours. Thus, the piezoelectric ceramic layers and the internal electrodes were integrally sintered. The portion to serve as the drive portion was polarized in the layered direction of the piezoelectric layers and the portion to serve as a power generation portion was polarized in the direction perpendicular to the layered direction, at a predetermined voltage. Thus, a monolithic piezoelectric transformer body having the driver portion A and the power generation portion B was obtained.

The pair of external input electrodes 2 and the output electrode 4 were respectively formed on the drive portion A and the power generation portion B by thick film deposition. Thus, monolithic piezoelectric transformers of Examples 1 to 12 were completed.

As Comparative Examples 1 and 2, monolithic piezoelectric transformers were prepared in an identical manner to Examples 1 to 12 except that the metal element of the metal organic, which is at least one of rhodium and iridium, was replaced with gold and the gold content was set as shown in Table 1.

The resulting monolithic piezoelectric transformers of Examples 1–12 and Comparative Examples 1–2 were subjected to measurements of (1) equivalent series resistance (ESR) of the primary side (drive portion A) before polarization, (2) flexural strength after polarization, and (3) variation of capacitance of the primary side (drive portion A) after polarization. Table 1 shows the metal element of the organic metal and its content relative to the silver-palladium powder (Ag: Pd=7:3, on a weight basis), and properties of the monolithic piezoelectric transformer.

The properties of each example are comprehensively rated as good, fair, or bad. "Good" refers to an example that led to a satisfactory improvement; "fair" refers to an example that led to a small improvement; and "bad" refers to an example that exhibited the same properties as in the known piezoelectric transformer, that is, did not exhibit improved properties. The manner of evaluation is also applied to the examples in Table 2.

Table 1 suggests that the present invention can achieve a monolithic piezoelectric transformer exhibiting a low ESR in the primary side (drive portion A) before polarization, a high flexural strength and a small capacitance variation. The reason for the low ESR of the primary side (drive portion A) before polarization is that the internal electrodes have a high continuity and, consequently, achieve good electrical connection with a low connection loss, and that the uniformity of the internal electrodes is enhanced to reduce the resistance of the electrodes. Also, since the internal electrodes do not suffer defects at the ends thereof, stress concentration resulting from polarization distortion can be dispersed. For this reason, the flexural strength is high. Furthermore, the areas of the electrodes become uniform since the uniformity of the internal electrodes is improved. For this reason, variation of the capacitance is small.

Moreover, as shown in Table 1, it is preferable that the internal electrodes 3 contain at least one of rhodium and iridium in an amount of about 0.01 to 5 parts by weight relative to 100 parts by weight of the Ag—Pd powder.

Figure 4:
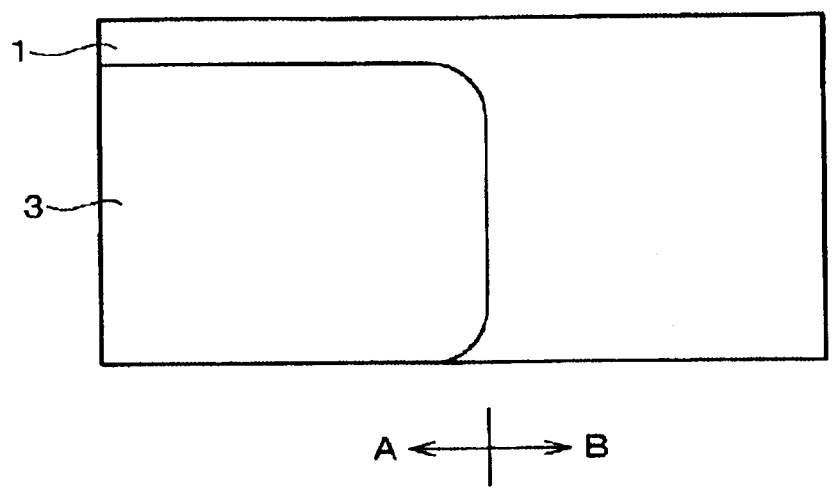
FIG. 4 is a schematic representation of an internal electrode of the monolithic piezoelectric transformer.
Figure 5:
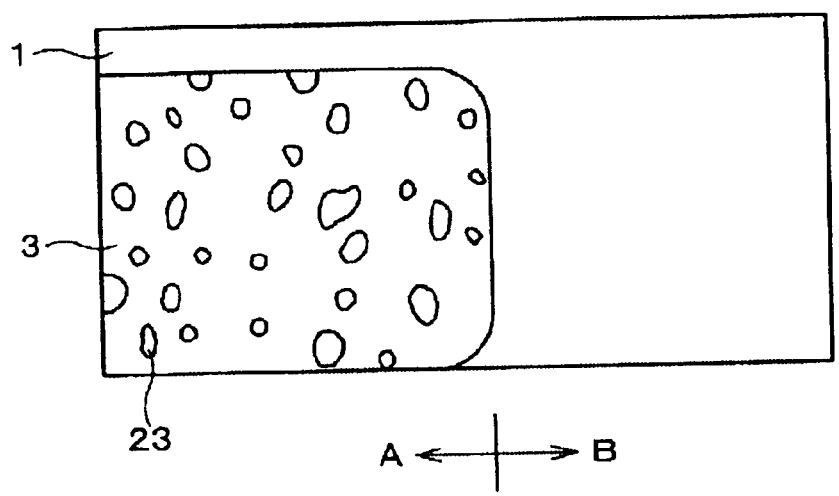
FIG. 5 is a schematic illustration of an internal electrode of a monolithic piezoelectric transformer in a comparative example.

The cross sections of the internal electrodes in Examples 1 to 12 and Comparative Examples 1 and 2 was observed. As a result, it has been seen that the continuity of the internal electrodes in Examples 1 to 12 was enhanced in comparison with the known internal electrodes. FIG. 4 shows the state of the internal electrodes 3 of the monolithic piezoelectric transformer according to the present invention, and FIG. 5 shows the state of the internal electrodes 3 of one of the comparative examples, or the known monolithic piezoelectric transformer. As shown in FIG. 5, the internal electrodes 3 of the comparative example exhibited many diffusion regions 23 where the thickness of the internal electrodes was reduced by the diffusion of metal components in the internal electrodes 3. These diffusion regions 23 cause the properties to deteriorate.

TABLE 1

| | METAL ELEMENT OF ORGANIC METAL | METAL CONTENT (PART BY WEIGHT) | PRIMARY SIDE ESR (MΩ) | CAPACITANCE VARIATION DEVIATION/AVERAGE (%) | FLEXURAL STRENGTH (MPA) | EVALUATION |
|---|---|---|---|---|---|---|
| COMPARATIVE EXAMPLE 1 | Au | 1.0 | 330 | 1.5 | 95 | BAD |
| COMPARATIVE EXAMPLE 2 | Au | 5.0 | 330 | 1.4 | 100 | BAD |
| EXAMPLE 1 | Rh | 0.005 | 270 | 0.95 | 110 | FAIR |
| EXAMPLE 2 | Ir | 0.005 | 250 | 1.0 | 113 | FAIR |
| EXAMPLE 3 | Rh | 0.01 | 220 | 0.85 | 123 | GOOD |
| EXAMPLE 4 | Ir | 0.01 | 220 | 0.88 | 119 | GOOD |
| EXAMPLE 5 | Rh | 0.5 | 210 | 0.87 | 122 | GOOD |
| EXAMPLE 6 | Ir | 0.5 | 210 | 0.86 | 120 | GOOD |
| EXAMPLE 7 | Rh, Ir | 0.5, 0.5 | 200 | 0.84 | 123 | GOOD |
| EXAMPLE 8 | Ir | 0.5 | 200 | 0.83 | 120 | GOOD |
| EXAMPLE 9 | Rh, Ir | 1.0, 0.5 | 200 | 0.83 | 125 | GOOD |
| EXAMPLE 10 | Rh, Ir | 1.5, 1.5 | 200 | 0.85 | 124 | GOOD |
| EXAMPLE 11 | Rh | 5.0 | 195 | 0.81 | 122 | GOOD |
| EXAMPLE 12 | Ir | 5.0 | 195 | 0.82 | 126 | GOOD |

Second Examples

In Examples 13 to 24, the primary metal is a conductive powder containing only Ag. Into 40 parts by weight of the organic vehicle prepared in the first examples, 100 parts by weight of the Ag powder and a metal organic (balsam sulfide Rh or balsam sulfide Ir) were added. The amount of the metal organic was set according to the content of the secondary metal element shown in Table 2. The mixture was kneaded with a three-roll kneader to yield an internal electrode paste.

Then, monolithic piezoelectric transformers were prepared in an identical manner to the first examples. As Comparative Examples 3 and 4, monolithic piezoelectric transformers were prepared as in Examples 13 to 24 except that the metal element of the metal organic was replaced with gold and the gold content was set as shown in Table 2. The properties of the monolithic piezoelectric transformers were evaluated as in the first examples. Table 2 shows the metal element of the organic metal and its content and property values.

As shown in Table 2, a monolithic piezoelectric transformer can be achieved which has a low ESR in the primary side (drive portion A) before polarization, a high flexural strength, and a small capacitance variation by using the internal electrode paste of the present invention, which contains the silver as an internal electrode material and at least one of rhodium and iridium.

As also shown in Table 2, it is preferable that the internal electrodes 3 contain at least one of rhodium and iridium in an amount of about 0.01 to 5 parts by weight relative to 100 parts by weight of the Ag powder.

The cross sections of the internal electrodes in Examples 13 to 24 and Comparative Examples 3 and 4 was observed. As a result, it has shown that the continuity of the internal electrodes 3 in Examples 13 to 24 was enhanced.

TABLE 2

| | METAL ELEMENT OF ORGANIC METAL | METAL CONTENT (PART BY WEIGHT) | PRIMARY SIDE ESR (MΩ) | CAPACITANCE VARIATION DEVIATION/AVERAGE (%) | FLEXURAL STRENGTH (MPA) | EVALUATION |
|---|---|---|---|---|---|---|
| COMARATIVE EXAMPLE 3 | Au | 1.0 | 340 | 1.6 | 90 | BAD |
| COMPARATIVE EXAMPLE 4 | Au | 5.0 | 320 | 1.5 | 95 | BAD |
| EXAMPLE 13 | Rh | 0.005 | 250 | 1.0 | 110 | FAIR |
| EXAMPLE 14 | Ir | 0.005 | 260 | 0.95 | 113 | FAIR |
| EXAMPLE 15 | Rh | 0.01 | 210 | 0.82 | 121 | GOOD |
| EXAMPLE 16 | Ir | 0.01 | 230 | 0.83 | 117 | GOOD |
| EXAMPLE 17 | Rh | 0.5 | 220 | 0.88 | 121 | GOOD |
| EXAMPLE 18 | Ir | 0.5 | 220 | 0.84 | 123 | GOOD |
| EXAMPLE 19 | Rh, Ir | 0.5, 0.5 | 210 | 0.82 | 121 | GOOD |
| EXAMPLE 20 | Ir | 0.5 | 210 | 0.82 | 123 | GOOD |
| EXAMPLE 21 | Rh, Ir | 1.0, 0.5 | 210 | 0.85 | 121 | GOOD |
| EXAMPLE 22 | Rh, Ir | 1.5, 1.5 | 210 | 0.83 | 121 | GOOD |
| EXAMPLE 23 | Rh | 5.0 | 190 | 0.80 | 124 | GOOD |
| EXAMPLE 24 | Ir | 5.0 | 190 | 0.81 | 122 | GOOD |

What is claimed is:

1. A monolithic piezoelectric transformer having a plurality of integrally sintered piezoelectric ceramic layers , comprising:
    a drive portion including a plurality of the piezoelectric ceramic layers polarized in the layered direction, a plurality of internal electrodes alternately layered with the piezoelectric layers, and a pair of external input electrodes each of which is connected to a different one of said internal electrodes, and
    a power generation portion including a piezoelectric ceramic member polarized in the direction perpendicular to the layered direction and an output electrode,
    wherein the internal electrodes comprises a primary metal which is at least one of silver and palladium and a secondary metal which is at least one of rhodium and iridium.

2. A monolithic piezoelectric transformer according to claim 1, wherein the content of the secondary metal is in the range of about 0.01 to 5 parts by weight relative to 100 parts by weight of the primary metal.

3. A monolithic piezoelectric transformer according to claim 2, wherein the primary metal is a combination of Ag and Pd.

4. A monolithic piezoelectric transformer according to claim 3, wherein the secondary metal is Rh.

5. A monolithic piezoelectric transformer according to claim 3, wherein the secondary metal is Ir.

6. A monolithic piezoelectric transformer according to claim 3, wherein the secondary metal is a combination of Rh and Ir.

7. A monolithic piezoelectric transformer according to claim 2, wherein the primary metal is Ag.

8. A monolithic piezoelectric transformer according to claim 7, wherein the secondary metal is Rh.

9. A monolithic piezoelectric transformer according to claim 7, wherein the secondary metal is Ir.

10. A monolithic piezoelectric transformer according to claim 7, wherein the secondary metal is a combination of Rh and ft.

11. A monolithic piezoelectric transformer according to claim 2, wherein the secondary metal was a metal organic before sintering.

12. A monolithic piezoelectric transformer according to claim 1, wherein the secondary metal was a metal organic before sintering.

* * * * *